(12) United States Patent
Shepherd et al.

(10) Patent No.: US 11,282,236 B2
(45) Date of Patent: Mar. 22, 2022

(54) XOR PROCESSING OF VOXELS OF THREE-DIMENSIONAL MODELS

(71) Applicant: HEWLETT-PACKARD DEVELOPMENT COMPANY, L.P., Houston, TX (US)

(72) Inventors: Matthew A. Shepherd, Vancouver, WA (US); Josh Shepherd, Vancouver, WA (US); Scott White, Boise, ID (US); Sergio Gonzalez, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 812 days.

(21) Appl. No.: 16/076,108

(22) PCT Filed: Jul. 31, 2017

(86) PCT No.: PCT/US2017/044644
§ 371 (c)(1),
(2) Date: Aug. 7, 2018

(87) PCT Pub. No.: WO2019/027415
PCT Pub. Date: Feb. 7, 2019

(65) Prior Publication Data
US 2021/0201537 A1    Jul. 1, 2021

(51) Int. Cl.
*G06T 9/00* (2006.01)
(52) U.S. Cl.
CPC ..................................... *G06T 9/00* (2013.01)
(58) Field of Classification Search
CPC ...................................................... G06T 9/00
See application file for complete search history.

(56) References Cited

U.S. PATENT DOCUMENTS

| 5,335,299 A | 8/1994 | Atkinson |
| 6,556,199 B1 * | 4/2003 | Fang ...................... G06T 15/08 |
| | | 345/424 |

(Continued)

FOREIGN PATENT DOCUMENTS

| CN | 103927424 A | 7/2014 |
| WO | 2016135510 A1 | 9/2016 |
| WO | WO 2019/027415 A1 | 2/2019 |

OTHER PUBLICATIONS

Graph-Based Compression of Dynamic 3D Point Cloud Sequences, Thanou et al.; IEEE Transactions on Image Processing; vol. 25, No. 4; Apr. 2016.

(Continued)

*Primary Examiner* — David T Welch
(74) *Attorney, Agent, or Firm* — Dicke Billig & Czaja PLLC

(57) ABSTRACT

One example of a method includes receiving a three-dimensional (3D) model of an object to be 3D printed and voxelizing the 3D model to define a plurality of voxel layers. Each voxel layer defines a plurality of voxel rows including an initial voxel row. The method includes for each voxel layer: exclusively oring (XORing) a key voxel row with the initial voxel row to provide an initial delta row; and for each voxel row from the voxel row following the initial voxel row to a further voxel row of the plurality of voxel rows, XORing each voxel row with the previous voxel row to provide a delta row for each voxel row.

11 Claims, 10 Drawing Sheets

(56) References Cited

U.S. PATENT DOCUMENTS

| | | |
|---|---|---|
| 8,885,925 B2 | 11/2014 | Cameron et al. |
| 9,311,737 B1 | 4/2016 | Wrenninge |
| 9,390,110 B2 | 7/2016 | Thiyanaratnam |
| 2003/0090397 A1 | 5/2003 | Rasmussen |
| 2003/0113029 A1 | 6/2003 | Mclaughlin |
| 2006/0115170 A1* | 6/2006 | Brakus, Jr. ............ H04N 1/419 382/245 |
| 2011/0153700 A1 | 6/2011 | Gopal et al. |
| 2015/0086013 A1 | 3/2015 | Metzler et al. |
| 2016/0086353 A1 | 3/2016 | Lukac et al. |
| 2017/0084079 A1* | 3/2017 | Hamada ................. G06T 17/10 |
| 2017/0178388 A1 | 6/2017 | Bisson et al. |
| 2017/0347120 A1* | 11/2017 | Chou .................. H04N 19/147 |
| 2020/0364907 A1* | 11/2020 | Tomic ................. G06K 15/128 |

OTHER PUBLICATIONS

Real-time Compression of Point Cloud Streams, Kammerl et al.; 2012 IEEE International Conference on Robotics and Automation; pp. 778-785; May 2012.

Tanner et al., "3-Dimensional Volume Representation for Geospatial Data in Voxel Models", Retrieved from Internet: https://www.asprs.org/a/publications/proceedings/Sacramento2012/files/Tanner.pdf, 2012, 6 pages.

* cited by examiner

XOR PROCESSING OF VOXELS OF THREE-DIMENSIONAL MODELS

BACKGROUND

Printing technologies may be used to create three-dimensional (3D) objects from data output from a computerized modeling source. For example, a 3D object may be designed using a computer program (e.g., a computer aided design (CAD) application) to generate a 3D model of the object, and the computer may output the data of the 3D model to a printing system capable of forming the solid 3D object. Solid free-form fabrication (or layer manufacturing) may be defined generally as a fabrication technology used to build a 3D object using layer by layer or point-by-point fabrication. With this fabrication process, complex shapes may be formed without the use of a pre-shaped die or mold. Three-dimensional models may use a polygon mesh to define the shape of the 3D object. The polygon mesh may include of a plurality of vertices (points in the space), edges (the connections between the vertices), and faces (a set of at least three or four edges describing a triangle or a rectangle, respectively).

DETAILED DESCRIPTION

Figure 1:
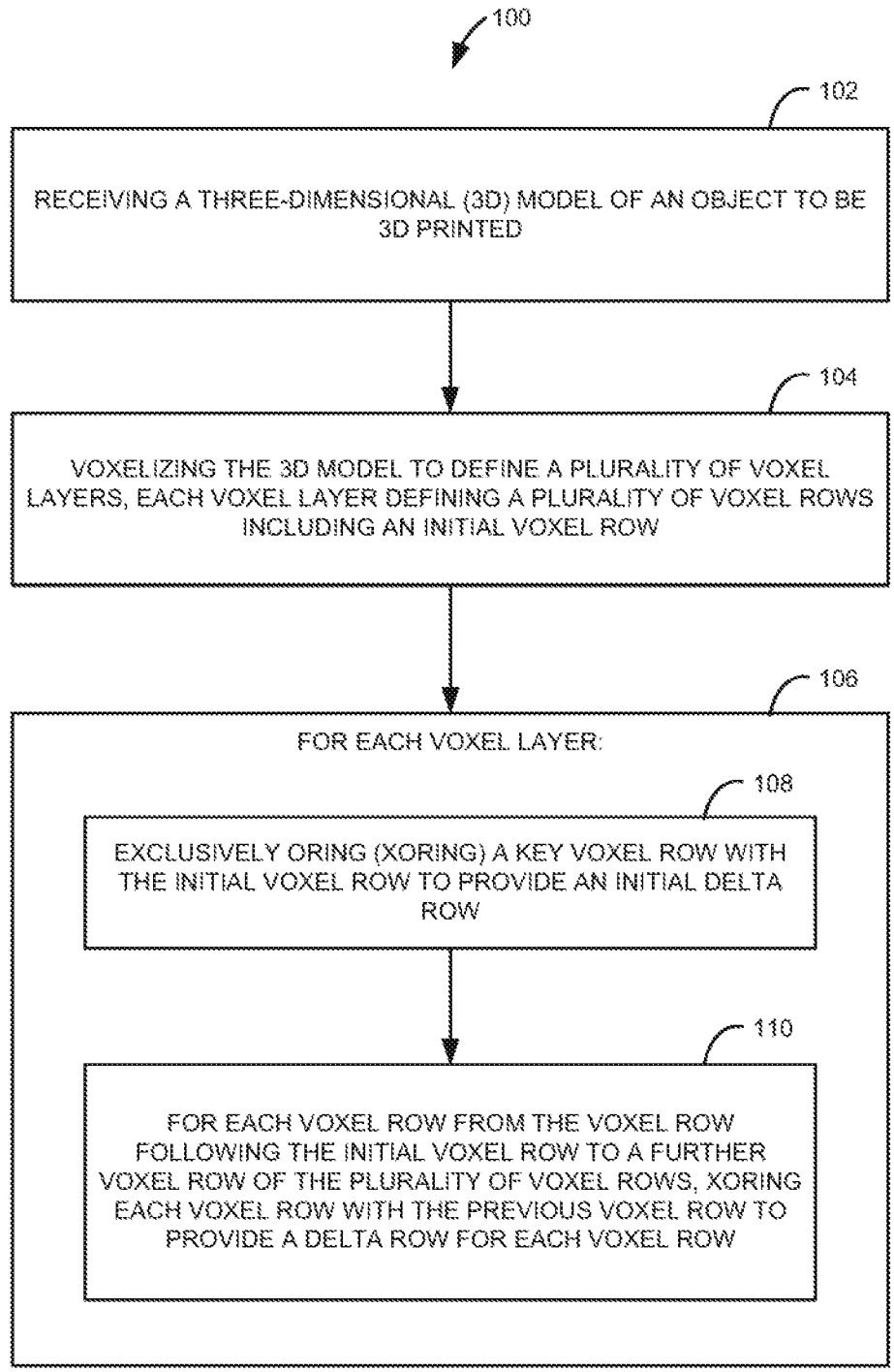
FIG. 1 is a flow diagram illustrating one example of a method for compressing voxels of a three-dimensional (3D) model of an object.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

For voxel space models of objects in 3D (or motion-voxel models in 4D etc.) in the digital domain, the uncompressed size of the data used to represent the voxels may be too large to be practical, therefore compression is desirable. Further, since the sheer number of bytes to be compressed is very large, high speed compression is desirable, especially for when color and/or properties are encoded. For example, a 3D printer bed of 8×14×10 inches at 600×600×300 dots per inch (dpi) (i.e., 42-⅓ μm×42-⅓ μm×80 μm) is roughly 128×10⁹ voxels. If there is, for example, color and normal data at approximately 8 bytes/voxel, then this bed represents around $10^{10}$ bytes of data to process.

Accordingly, disclosed herein is a high speed compression technique to reduce the amount of data used for representing voxel space models of 3D objects. A 3D model (e.g., vector or mesh model) of an object to be 3D printed is voxelized to provide a plurality of voxel layers. Each voxel layer includes a plurality of rows, where each row is a linear array of voxel values. For each voxel layer, an initial row of each voxel layer is XORed with a key row to provide an initial delta row, which indicates changes between the key row and the initial row. Each remaining row of each voxel layer is XORed with the previous row to provide a delta row for each row, which indicates changes between each row and the previous row. Each delta row of each voxel layer may then be encoded using run length encoding and further compressed and/or encrypted. By determining only the changes between rows within voxel layers, the data to store the voxel space model can be significantly reduced. The process is reversible to obtain the original voxel space model. The method can be extended to any number of dimensions. For example, prior to XORing each row of each voxel layer, adjacent voxel layers may be XORed with each other.

The disclosed technique may be faster than octree 3D compression techniques and 2D lossless compression schemes at the same compression ratio. The technique may take full advantage of parallelism of central processing units (CPUs) and graphics processing units (GPUs). Tiling may be used with the technique in Z, Y, and X such that sub-volumes may be processed without decompressing the surrounding full layer volume. The tiling also allows for high degrees of parallelism (i.e., one sub-volume's result does not depend upon another). The tiling also enables the passing of compressed sub-volumes in memory access rate constrained systems (e.g., between CPU and GPU).

FIG. 1 is a flow diagram illustrating one example of a method 100 for compressing voxels of a 3D model of an object. In one example, method 100 is implemented via a processor, such as processor 402, which will be described with reference to FIG. 4. In this example, two-dimensional (2D) voxel layer data is compressed. At 102, method 100 includes receiving a 3D model of an object to be 3D printed. In one example, the 3D model of the object to be 3D printed is a polygon mesh model or another suitable model (e.g., a stereolithography file format (STL), an OBJ file format (OBJ), a 3MF file format, or a virtual reality modeling language (VRML) file format). At 104, method 100 includes voxelizing the 3D model to define a plurality of voxel layers, each voxel layer defining a plurality of voxel rows including an initial voxel row.

At 106, method 100 implements blocks 108 and 110 for each voxel layer. For each voxel layer at 108, method 100 includes exclusively oring (XORing) a key voxel row with the initial voxel row to provide an initial delta row. In one example, the key voxel row is a predefined voxel row of expected values for the initial voxel row, such as all 0's indicating locations where no material is to be printed or all 1's indicating locations where material is to be printed. The initial delta row indicates which voxels of the initial voxel row are different from the corresponding voxels of the key voxel row.

For each voxel layer at 110, method 100 includes for each voxel row from the voxel row following the initial voxel row to a further voxel row of the plurality of voxel rows, XORing each voxel row with the previous voxel row to provide a delta row for each voxel row. The delta row for each voxel row indicates which voxels of the voxel row are different from the adjacent voxels of the previous voxel row. The XOR operations for the initial voxel row and each voxel row following the initial voxel row are implemented based on a bit width, such as a CPU instruction width. For example, a CPU with a processing width of 32 bits per instruction may execute 32 bitwise XOR operations for each voxel row simultaneously. Thus, each voxel row is divided into 32 bit segments for the XOR operations. Likewise, a CPU with a processing width of 512 bits per instruction may execute 512 bitwise XOR operations for each voxel row simultaneously. Thus, in this example each voxel row is divided into 512 bit segments for the XOR operations.

In one example, method 100 further includes XORing the key row with the voxel row following the further voxel row to provide a further initial delta row for each voxel layer. In this case for each voxel layer, method 100 further includes for each voxel row from the voxel row following the voxel row following the further voxel row to a yet further voxel row of the plurality of voxel rows, XORing each voxel row with the previous voxel row to provide a delta row for each voxel row. For each voxel layer, the XORing for each voxel row from the voxel row following the initial voxel row to the further voxel row may be implemented in parallel with the XORing for each voxel row from the voxel row following the voxel row following the further voxel row to the yet further voxel row. In this way, segments of the each voxel layer may be processed in parallel.

Method 100 may also include run length encoding each delta row of each voxel layer. Since each delta row of each voxel layer includes only the changes between adjacent voxel rows, many delta rows will include runs of bits indicating no changes. Therefore, the run length encoded voxel data for the 3D object is substantially compressed compared to the original voxel data for the 3D object. Examples for run length encoding will be described in more detail below with reference to FIG. 5.

Figure 2:
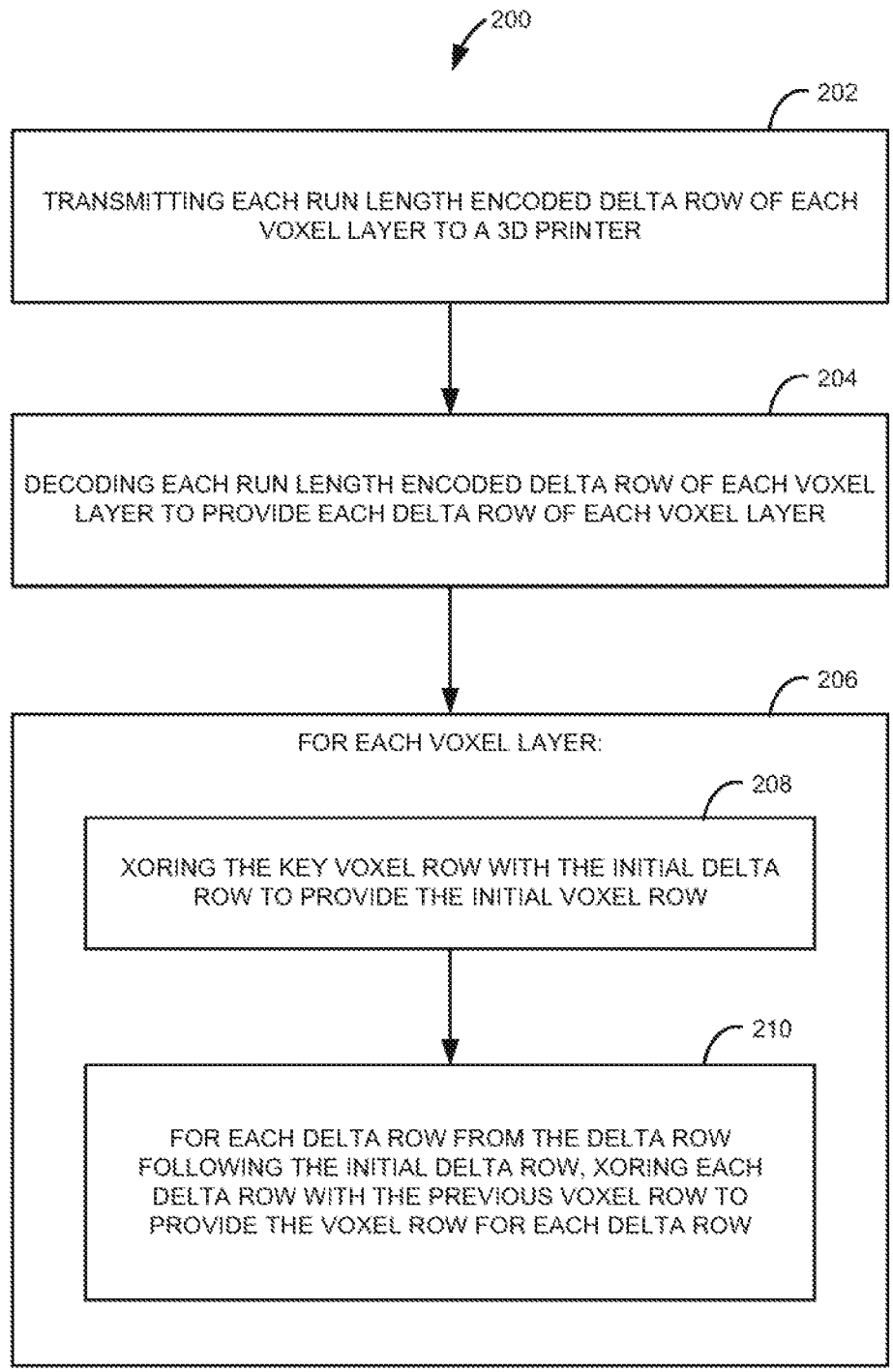
FIG. 2 is a flow diagram illustrating one example of a method for decompressing voxels of a 3D model of an object.

FIG. 2 is a flow diagram illustrating one example of a method 200 for decompressing voxels of a 3D model of an object. In one example, method 200 is implemented via a processor, such as processor 402, which will be described with reference to FIG. 4. At 202, method 200 includes transmitting each run length encoded delta row of each voxel layer to a 3D printer. At 204, method 200 includes decoding each run length encoded delta row of each voxel layer to provide each delta row of each voxel layer. At 206, method 200 implements blocks 208 and 210 for each voxel layer. For each voxel layer at 208, method 200 includes XORing the key voxel row with the initial delta row to provide the initial voxel row. For each voxel layer at 210, method 200 includes for each delta row from the delta row following the initial delta row, XORing each delta row with the previous voxel row to provide the voxel row for each delta row. Accordingly, the voxel space model that was compressed using the method described with reference to FIG. 1 is decompressed.

Figure 3:
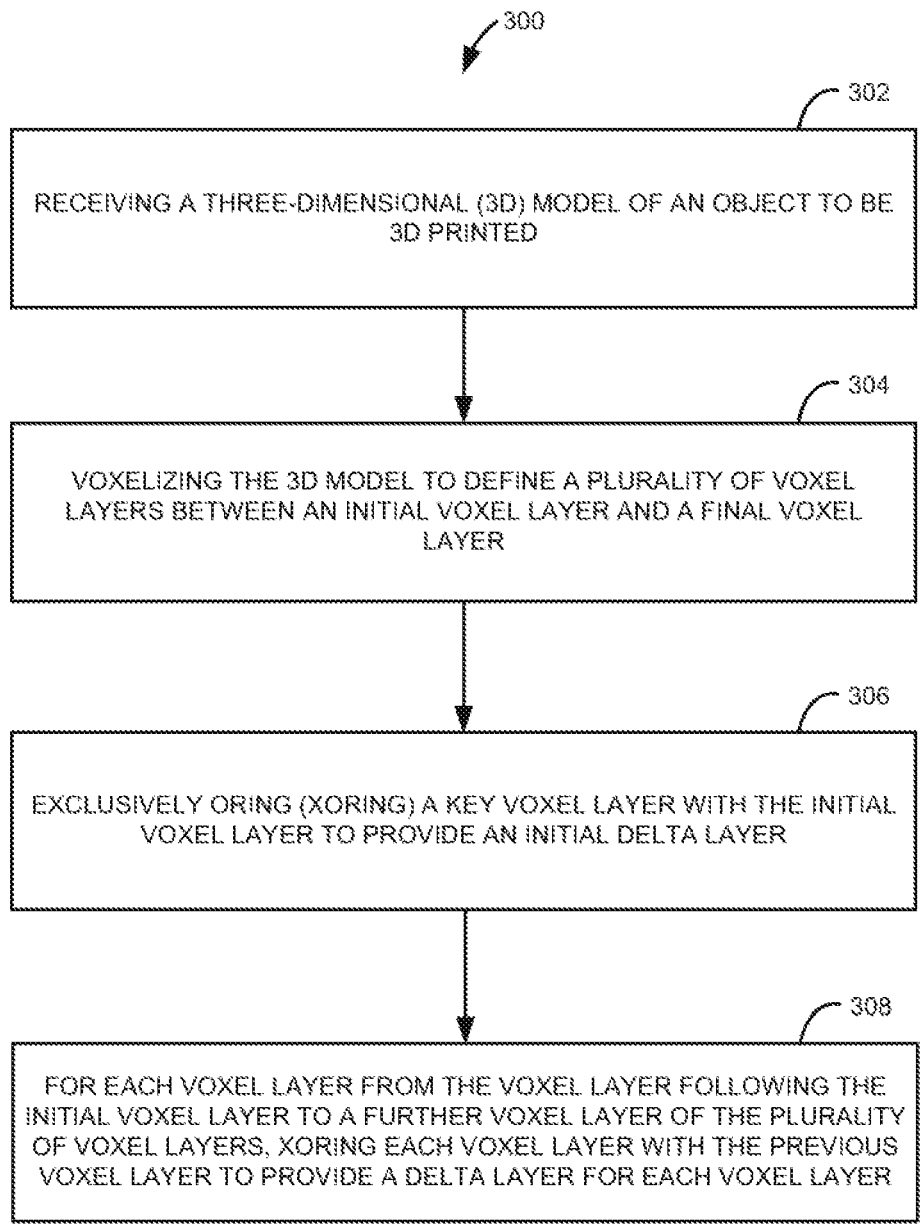
FIG. 3 is a flow diagram illustrating another example of a method for compressing voxels of a 3D model of an object.

FIG. 3 is a flow diagram illustrating another example of a method 300 for compressing voxels of a 3D model of an object. In one example, method 300 is implemented via a processor, such as processor 402, which will be described with reference to FIG. 4. In this example, 3D volume voxel data is compressed. At 302, method 300 includes receiving a 3D model of an object to be 3D printed. At 304, method 300 includes voxelizing the 3D model to define a plurality of voxel layers between an initial voxel layer and a final voxel layer. At 306, method 300 includes XORing a key voxel layer with the initial voxel layer to provide an initial delta layer. In one example, the key voxel layer is a predefined voxel layer of expected values for the initial voxel layer, such as all 0's or all 1's. The initial delta layer indicates which voxels of the initial voxel layer are different from the corresponding voxels of the key voxel layer.

At 308, method 300 includes for each voxel layer from the voxel layer following the initial voxel layer to a further voxel layer of the plurality of voxel layers, XORing each voxel layer with the previous voxel layer to provide a delta layer for each voxel layer. The delta layer for each voxel layer indicates which voxels of the voxel layer are different from the adjacent voxels of the previous voxel layer. The XOR operations for the initial voxel layer and each voxel layer following the initial voxel layer are implemented based on a bit width, such as a CPU instruction width. For example, a CPU with a processing width of 32 bits per instruction may execute 32 bitwise XOR operations for each voxel layer simultaneously. Thus, each voxel layer is divided into 32 bit segments for the XOR operations. Likewise, a CPU with a processing width of 512 bits per instruction may execute 512 bitwise XOR operations for each voxel layer simultaneously. Thus, in this example each voxel layer is divided into 512 bit segments for the XOR operations.

In one example, each delta layer includes a plurality of rows extending between an initial row and a final row. In this case, method 300 further includes as previously described in FIG. 1, XORing a key row with the initial row to provide an initial delta row for each delta layer. For each delta layer, for each row from the row following the initial row to a further row of the plurality of rows, method 300 includes XORing each row with the previous row to provide a delta row for each row. Method 300 may also include XORing the key row with the row following the further row to provide a further initial delta row. In this case for each row from the row following the row following the further row to a yet further row of the plurality of rows, the method includes XORing each row with the previous row to provide a delta row for each row. In another example, method 300 further includes run length encoding each delta row of each delta layer.

Method 300 may also include XORing the key voxel layer with the voxel layer following the further voxel layer to provide a further initial deltalayer. In this example, for each voxel layer from the voxel layer following the voxel layer following the further voxel layer to a yet further voxel layer of the plurality of voxel layers, method 300 includes XORing each voxel layer with the previous voxel layer to provide a delta layer for each voxel layer. The XORing for each voxel layer from the voxel layer following the initial voxel layer to the further voxel layer may be implemented in parallel with the XORing for each voxel layer from the voxel layer following the voxel layer following the further voxel layer to the yet further voxel layer. In this way, segments of the plurality of voxel layers may be processed in parallel.

Figure 4:
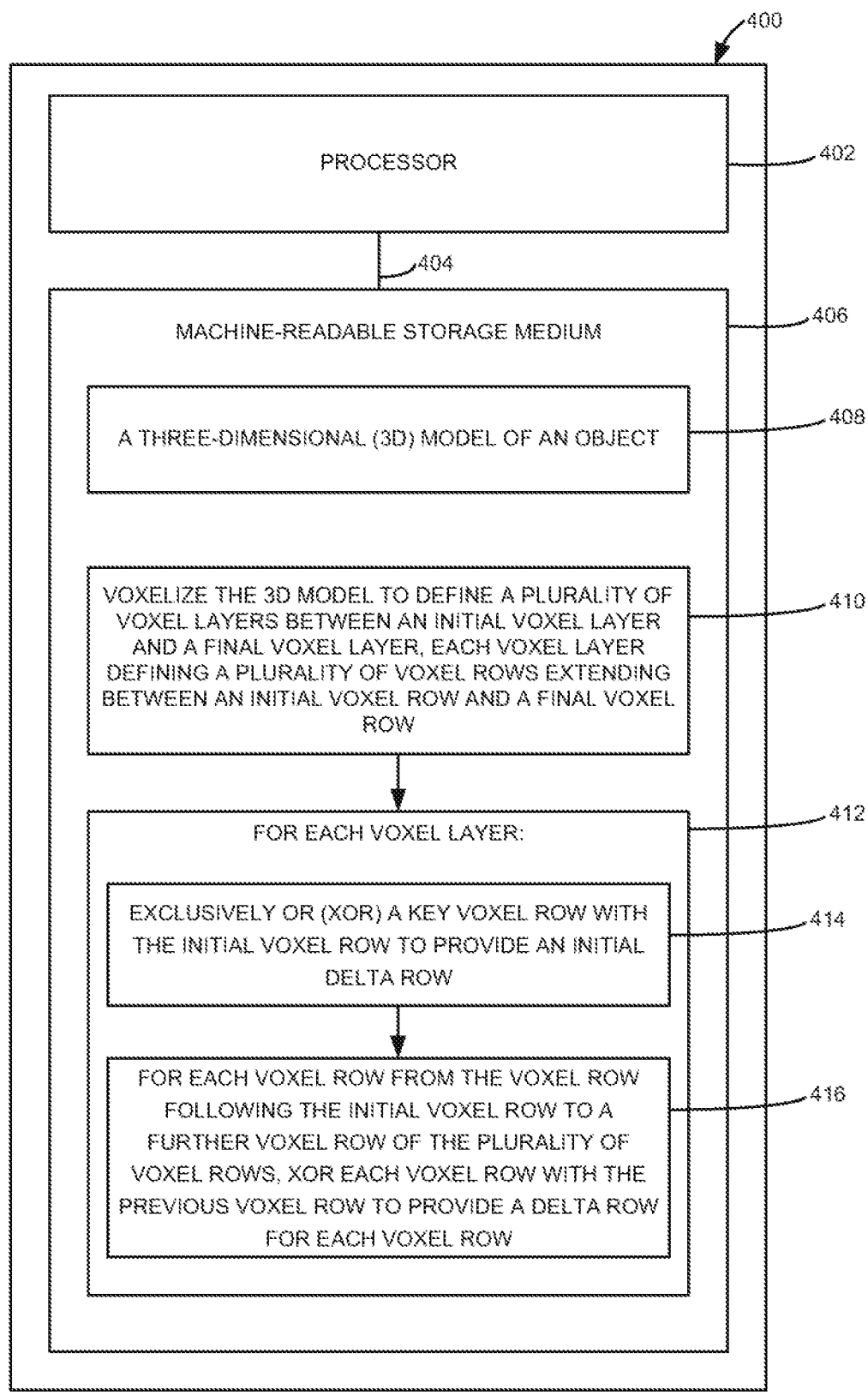
FIG. 4 is a block diagram illustrating one example of a processing system for compressing voxels of a 3D model of an object.

FIG. 4 is a block diagram illustrating one example of a processing system 400 for compressing voxels of a 3D model of an object. System 400 includes a processor 402 and a machine-readable storage medium 406. Processor 402 is communicatively coupled to machine-readable storage medium 406 through a communication path 404. Although the following description refers to a single processor and a single machine-readable storage medium, the description may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 402 includes one or more CPUs, microprocessors, and/or other suitable hardware devices for retrieval and execution of instructions stored in machine-readable storage medium 406. Machine-readable storage medium 406 may store data 408 including a 3D model of an object. Processor 402 may fetch, decode, and execute instructions 410-416 to voxelize and compress the voxel data for the 3D model of the object.

Processor 402 may fetch, decode, and execute instructions 410 to voxelize the 3D model to define a plurality of voxel layers between an initial voxel layer and a final voxel layer, each voxel layer defining a plurality of voxel rows extending between an initial voxel row and a final voxel row. Processor 402 may fetch, decode, and execute instructions 412 for each voxel layer. Instructions 412 include instructions 414 and 416. Processor 402 may fetch, decode, and execute instructions 414 to XOR a key voxel row with the initial voxel row to provide an initial delta row. Processor 402 may fetch, decode, and execute instructions 416 to, for each voxel row from the voxel row following the initial voxel row to a further voxel row of the plurality of voxel rows, XOR each voxel row with the previous voxel row to provide a delta row for each voxel row.

In one example, processor 402 may execute further instructions to run length encode each delta row of each voxel layer. In another example, processor 402 may execute further instructions to compress (e.g., gzip) or encrypt (e.g., AES256) the run length encoded delta rows of each voxel layer. Processor 402 may also execute further instructions to decompress the compressed voxel data including instructions to XOR the key voxel row with the initial delta row to provide the initial voxel row for each voxel layer. In this case for each voxel layer, processor 402 executes further instructions to, for each delta row from the delta row following the initial delta row, XOR each delta row with the previous voxel row to provide the voxel row for each delta row.

As an alternative or in addition to retrieving and executing instructions, processor 402 may include one or more electronic circuits comprising a number of electronic components for performing the functionality of one or more of the instructions in machine-readable storage medium 406. With respect to the executable instruction representations (e.g., boxes) described and illustrated herein, it should be understood that part or all of the executable instructions and/or electronic circuits included within one box may, in alternate examples, be included in a different box illustrated in the figures or in a different box not shown.

Machine-readable storage medium 406 is a non-transitory storage medium and may be any suitable electronic, magnetic, optical, or other physical storage device that stores executable instructions. Thus, machine-readable storage medium 406 may be, for example, random access memory (RAM), an electrically-erasable programmable read-only memory (EEPROM), a storage drive, an optical disc, and the like. Machine-readable storage medium 406 may be disposed within system 400, as illustrated in FIG. 4. In this case, the executable instructions may be installed on system 400. Alternatively, machine-readable storage medium 406 may be a portable, external, or remote storage medium that allows system 400 to download the instructions from the portable/external/remote storage medium. In this case, the executable instructions may be part of an installation package.

Figure 5:
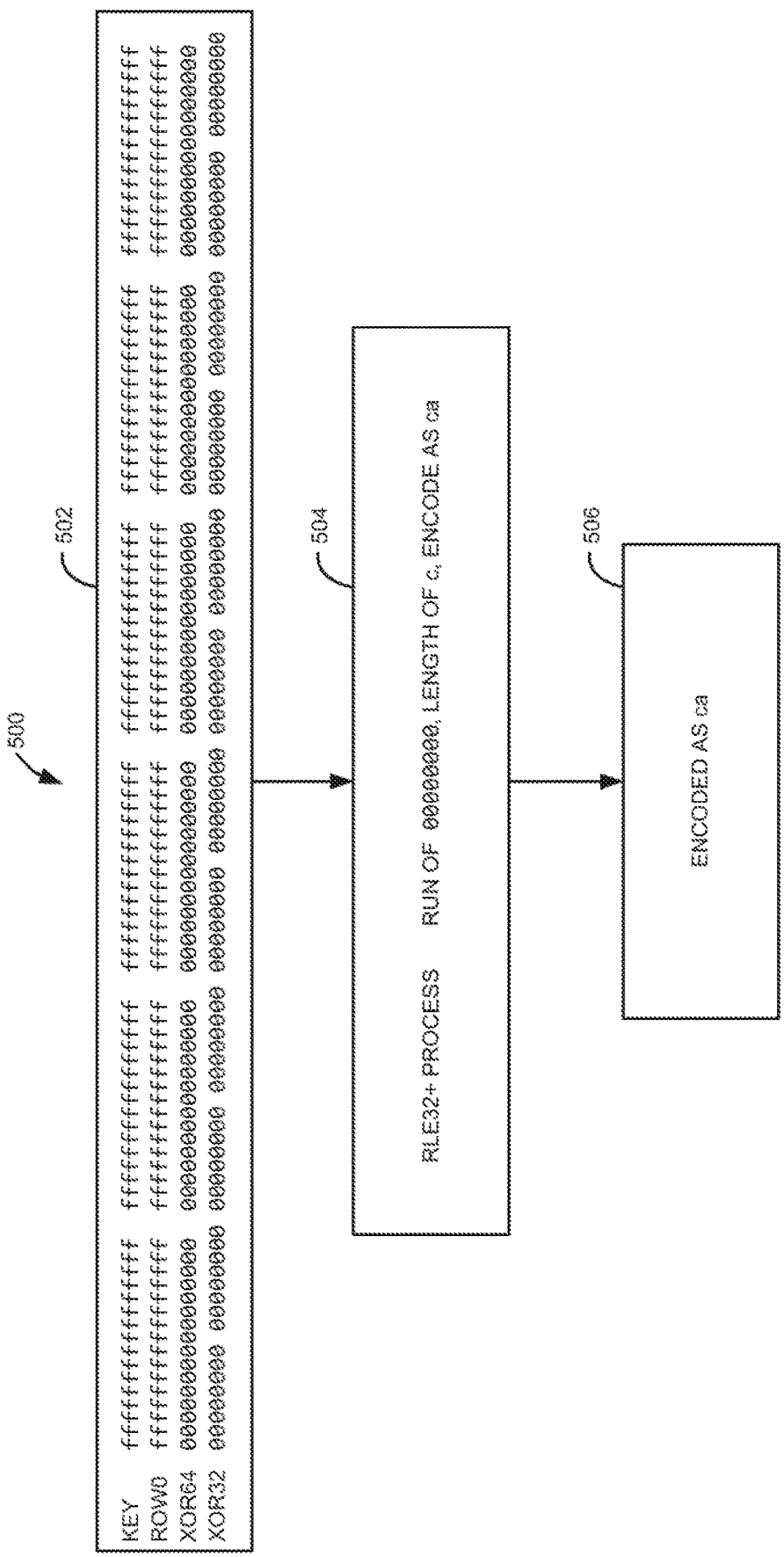
FIG. 5 is a flow diagram illustrating one example of compressing an initial row of voxels of a 3D model of an object.

FIG. 5 is a flow diagram 500 illustrating one example of compressing an initial row of voxels of a 3D model of an object. In this example, 384 voxels are illustrated for each row. At 502, a key row is defined and a row 0 (i.e., an initial row) is provided. Row 0 represents data of a single row of voxels in hexadecimal (HEX). In this example, row 0 is all ones, where each one indicates a voxel to be printed. The key row provides expected data for row 0 to initialize the XOR process. In this example, the key row is all ones. In other examples, the key row may be all zeros or a suitable combination of zeros and ones. The key row is XORed (bitwise) with row 0 to provide the delta row, as indicated at XOR64 for 64 bit XOR operations and as indicated at XOR32 for 32 bit XOR operations. In other examples, the XOR operations may have a 128 bit width, a 256 bit width, a 512 bit width, or another suitable bit width based on the CPU processing width. In this example, since the key row is all ones and row 0 is all ones, the XOR operation results in all zeros, indicating no changes between the key row and row 0.

At 504, using a run length encoding (RLE) process with a bit width of 32 (RLE32+) and the example rules defined in the following table, a run of 00000000 with a length of 12 (i.e., c in HEX) is determined. At 506, delta row 0 is encoded as "ca". As defined in the following table, the "a" in "ca" is due to the chunk being less than or equal to 15 (i.e., f in HEX) zeros long. "RLE" in the following table refers to a repeated non-zero word. "LIT" in the following table refers to a literal (i.e., a non-repeated word).

TABLE

Example RLE Rules
ROW COMPRESSION: per-chunk byte/nibble keys

Figure 6:
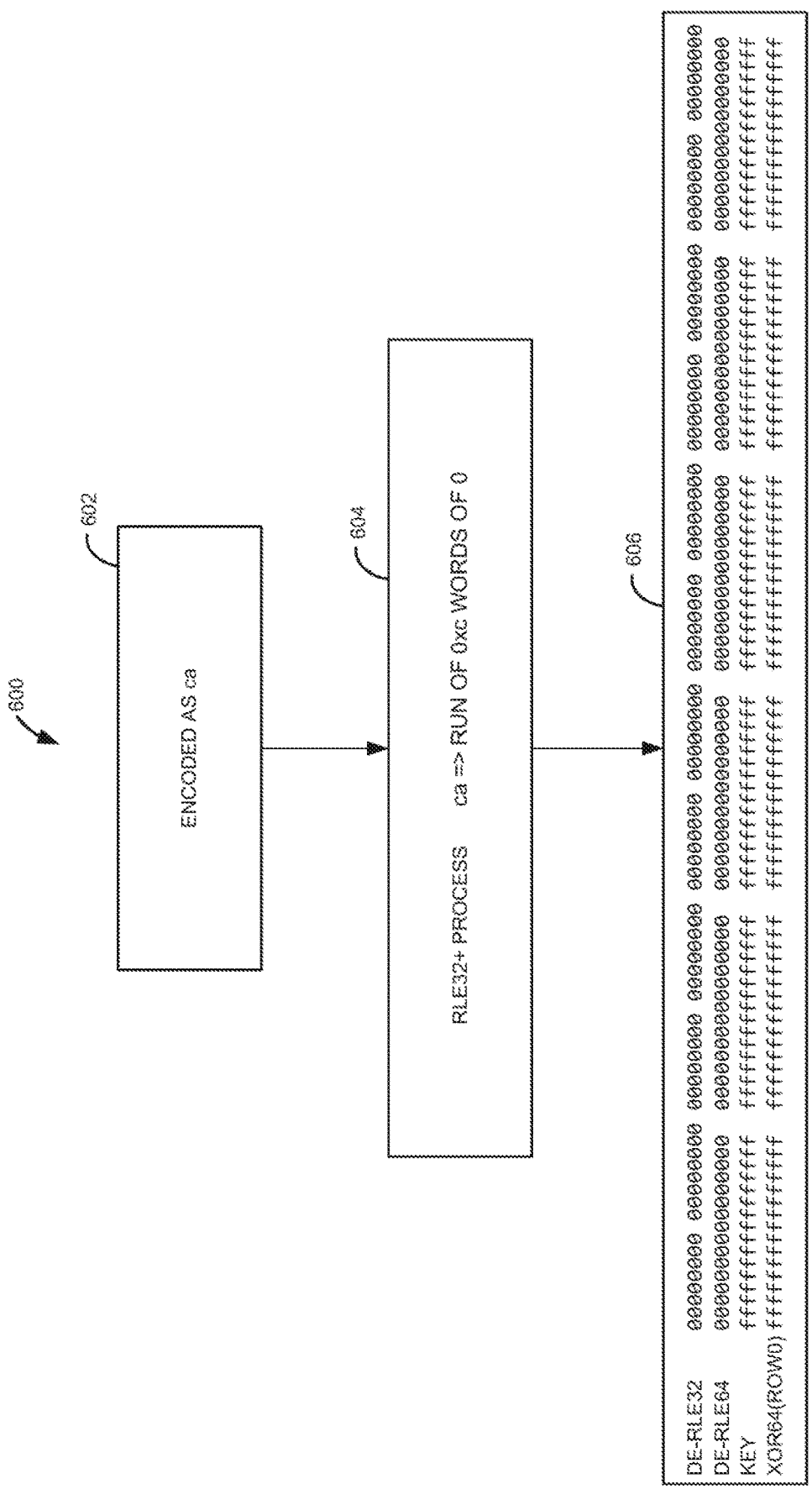
FIG. 6 is a flow diagram illustrating one example of decompressing the initial row of voxels of the 3D model of the object of FIG. 5.

4'b10xx:

a - xa: chunk is <=0xf u32's of 0s
9 - x9: chunk is <=0xf u32's RLE
8 - x8: chunk is <=0xf u32's LIT
4'b01xx:

6 - xxx6: chunk is <=0xfff u32's of 0s
5 - xxx5: chunk is <=0xfff u32's RLE
4 - xxx4: chunk is <=0xfff u32's LIT
4'b00xx:

2 - xxxxx2: chunk is <=0xfffff u32's of 0s
1 - xxxxx1: chunk is <=0xfffff u32's RLE
0 - xxxxx0: chunk is <=0xfffff u32's LIT FIG. 6 is a flow diagram 600 illustrating one example of decompressing the initial row of voxels of the 3D model of the object of FIG. 5. At 602, the delta row encoded as "ca" is received. At 604, the RLE32+ process decodes the "ca" to indicate a run of 0xc words of 0. At 606, the decompressed delta row 0 is indicated at DE-RLE32 for a 32 bit width and at DE-RLE64 for a 64 bit width. The decompressed delta row 0 is then XORed with the key row to provide the original row 0, as indicated at XOR64(ROW0).

Figure 7:
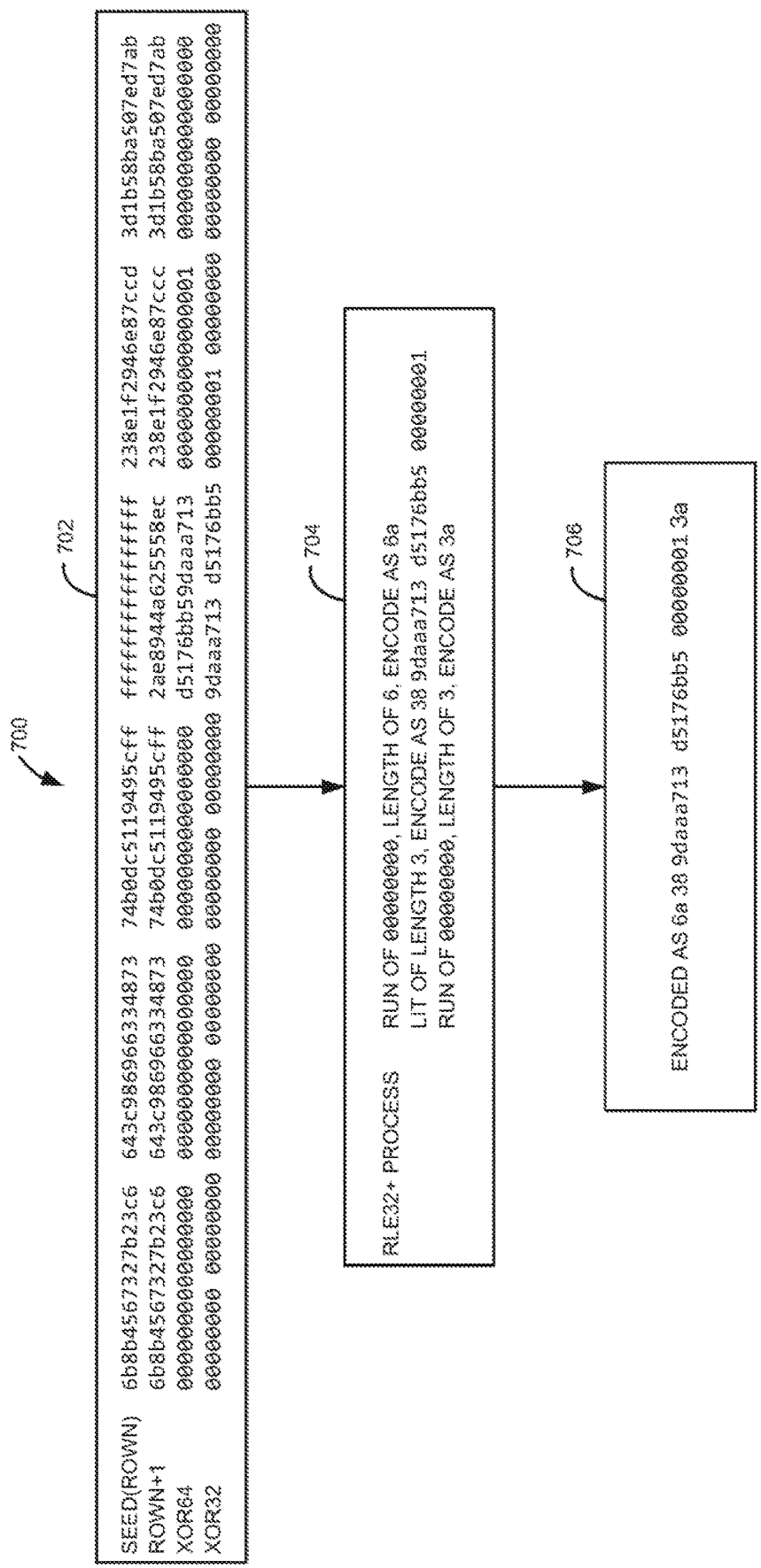
FIG. 7 is a flow diagram illustrating one example of compressing a middle row of voxels of a 3D model of an object.

FIG. 7 is a flow diagram 700 illustrating one example of compressing a middle row of voxels of a 3D model of an object. At 702, a seed row (row N) is provided and a row N+1 is provided. Row N represents data of one row of voxels in HEX and row N+1 represents data of the next row of voxels in HEX adjacent to row N. The seed row (row N) provides expected data for row N+1 for the XOR operation. The seed row (row N) Is XORed with row N+1 to provide the delta row for row N+1, as indicated at XOR64 for 64 bit XOR operations and as indicated at XOR32 for 32 bit XOR operations. In this example, some of the data changes between row N and row N+1, so the XOR operation results in some non-zero data indicating the changes between row N and row N+1.

At 704, using the RLE32+ process and the example rules defined in the above table, a run of 00000000 with a length of 6, a LIT of length 3, and a run of 00000000 of length 3 is determined. At 706, delta row N+1 is encoded as "6a 38 9daaa713 d5176bb5 00000001 3a".

Figure 8:
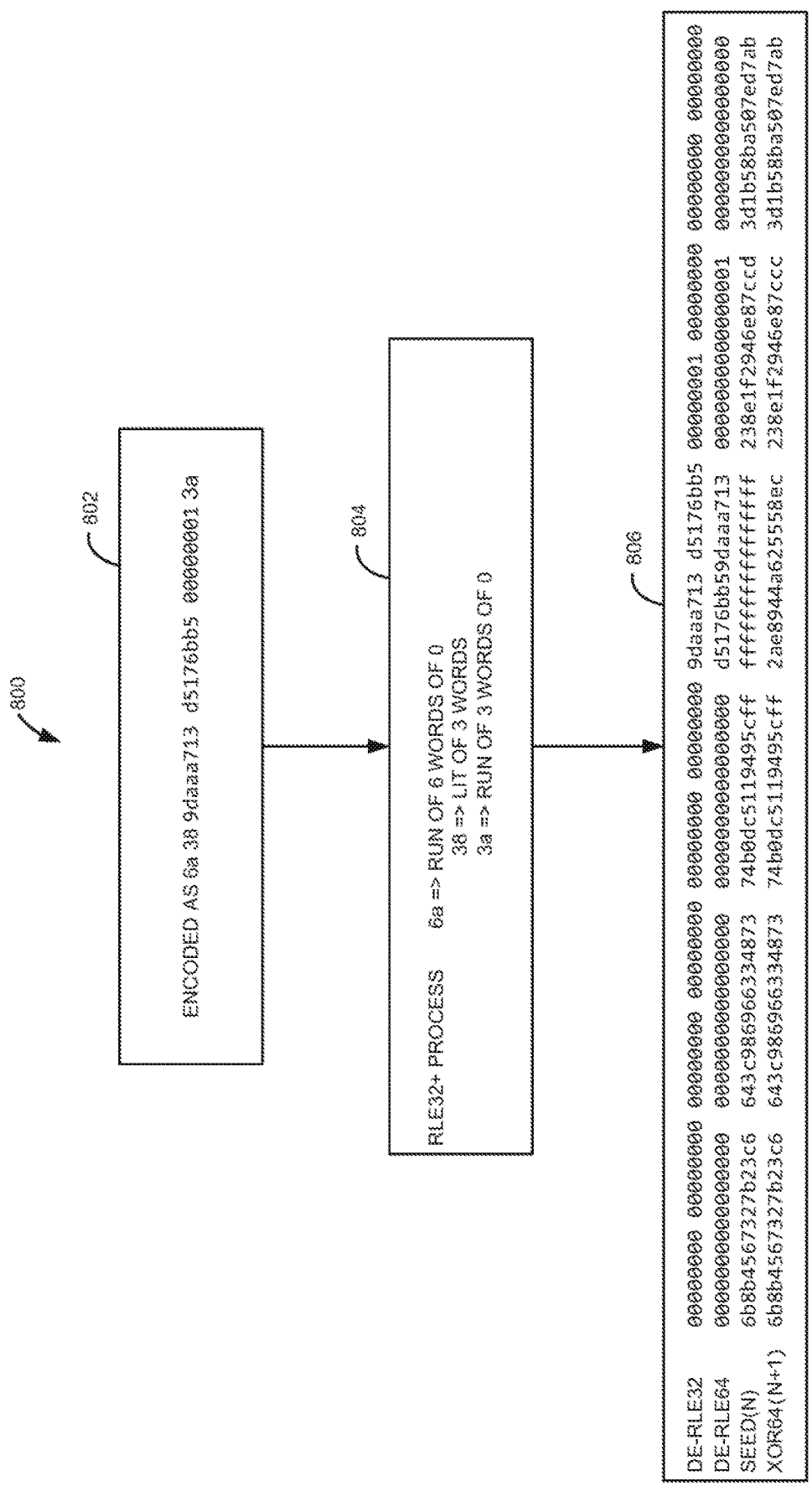
FIG. 8 is a flow diagram illustrating one example of decompressing the middle row of voxels of the 3D model of the object of FIG. 7.

FIG. 8 is a flow diagram 800 illustrating one example of decompressing the middle row of voxels of the 3D model of the object of FIG. 7. At 802, the delta row encoded as "6a 38 9daaa713 d5176bb5 00000001 3a" is received. At 804, the RLE32+ process decodes the "6a 38 9daaa713 d5176bb5 00000001 3a" to indicate a run of 6 words of 0, a literal of 3 words, and a run of 3 words of 0. At 806, the decompressed delta row N+1 is indicated at DE-RLE32 for a 32 bit width and at DE-RLE64 for a 64 bit width. The decompressed delta row N+1 is then XORed with the seed row (row N) to provide the original row N+1, as indicated at XOR64(N+1).

Figure 9:
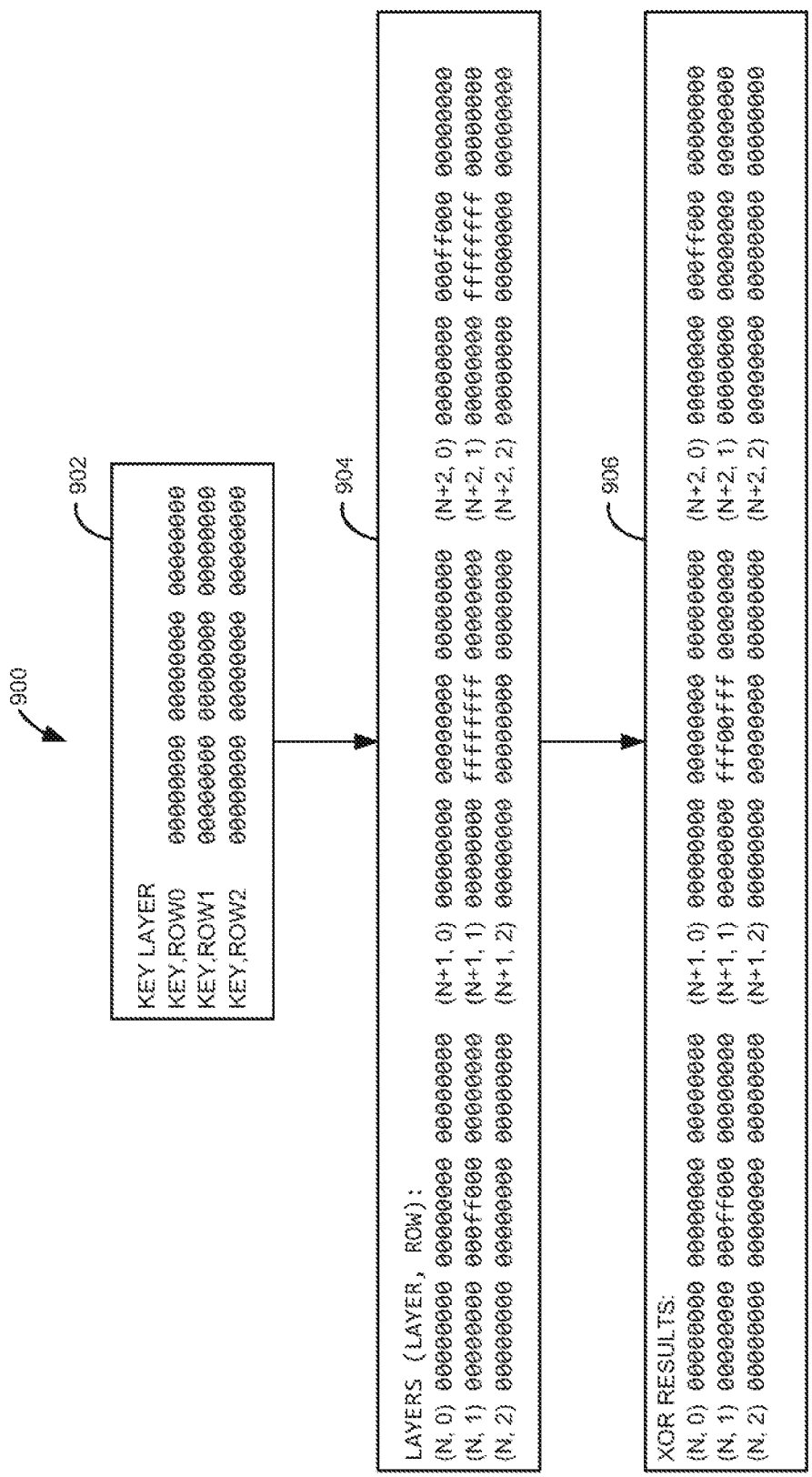
FIG. 9 is a flow diagram illustrating one example of compressing layers of voxels of a 3D model of an object.

FIG. 9 is a flow diagram 900 illustrating one example of compressing layers of voxels of a 3D model of an object. At 902, a key layer for compressing voxel layers is received. In this example, the key layer includes three rows and the key layer is all zeros. At 904, three layers: N, N+1, and N+2, with each voxel layer including three rows are provided. At 906, the key layer is XORed with layer N, layer N is XORed with layer N+1, and layer N+1 is XORed with layer N+2 to provide the XOR results (i.e., delta layer) for each layer. The delta layers are then further compressed using the 2D compression as described in the examples of FIGS. 5 and 7. The delta layers may be decompressed by reversing the process.

Figure 10:
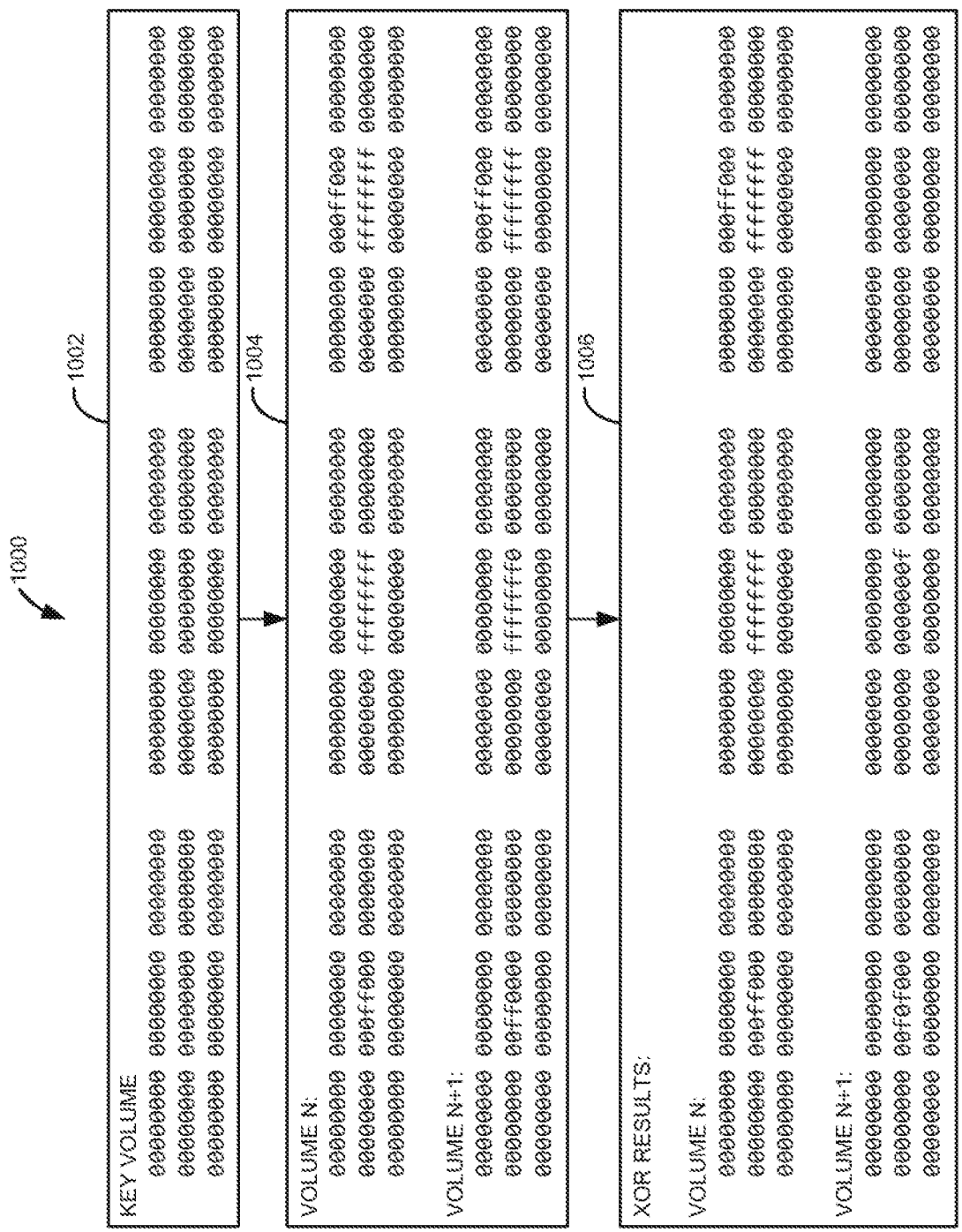
FIG. 10 is a flow diagram illustrating one example of compressing voxels of a 4D model of an object.

FIG. 10 is a flow diagram 1000 illustrating one example of compressing voxels of a 4D model of an object. At 1002, a key volume for compressing voxel volumes is received. In this example, the key volume is all zeros. At 1004, two voxel volumes N and N+1, with each voxel volume including 4D data (e.g., hypervolume or space-time) are provided. At 1006, the key volume is XORed with volume N and volume N is XORed with volume N+1 to provide the XOR results (i.e., delta volume) for each voxel volume. The delta volumes are then further compressed using the 3D compression as described in the example of FIG. 9 followed by further compression using the 2D compression as described in the examples of FIGS. 5 and 7. The delta volumes may be decompressed by reversing the process.

Accordingly, voxel data including any arbitrary number of dimensions may be compressed using the method disclosed herein. For example, layers (2D elements) may be compressed by performing XOR operations between rows (1D elements). Volumes (3D elements) may be compressed by performing XOR operations between layers (2D) elements followed by XOR operations between rows (1D) elements. Hypervolume or space-time (4D elements) may be compressed by performing XOR operations between volumes (3D elements), followed by XOR operations between layers (2D elements), which is followed by XOR operations between rows (1D elements). Hyperhypervolume (5D elements) may be compressed by performing XOR operations between hypervolume or space-time (4D elements), followed by performing XOR operations between volumes (3D elements), followed by XOR operations between layers (2D elements), which is followed by XOR operations between rows (1D elements). Voxels including higher dimensions may likewise be compressed. In each case, the compression is reversible to obtain the original voxel data.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A method comprising:
receiving, via a processor, a three-dimensional (3D) model of an object to be 3D printed;
voxelizing, via the processor, the 3D model to define a plurality of voxel layers, each voxel layer defining a plurality of voxel rows including an initial voxel row; and
for each voxel layer:
exclusively oring (XORing), via the processor, a key voxel row with the initial voxel row to provide an initial delta row;
for each voxel row from the voxel row following the initial voxel row to a further voxel row of the plurality of voxel rows, XORing via the processor each voxel row with the previous voxel row to provide a delta row for each voxel row;
XORing the key row with the voxel row following the further voxel row to provide a further initial delta row; and
for each voxel row from the voxel row following the voxel row following the further voxel row to a yet further voxel row of the plurality of voxel rows, XORing each voxel row with the previous voxel row to provide a delta row for each voxel row.

2. The method of claim 1, wherein for each voxel layer:
the XORing for each voxel row from the voxel row following the initial voxel row to the further voxel row is implemented in parallel with the XORing for each voxel row from the voxel row following the voxel row following the further voxel row to the yet further voxel row.

3. The method of claim 1, further comprising:
run length encoding each delta row of each voxel layer.

4. A method comprising:
receiving, via a processor, a three-dimensional (3D) model of an object to be 3D printed;
voxelizing, via the processor, the 3D model to define a plurality of voxel layers, each voxel layer defining a plurality of voxel rows including an initial voxel row;
for each voxel layer:
exclusively oring (XORing), via the processor, a key voxel row with the initial voxel row to provide an initial delta row; and
for each voxel row from the voxel row following the initial voxel row to a further voxel row of the plurality of voxel rows, XORing via the processor each voxel row with the previous voxel row to provide a delta row for each voxel row;
run length encoding each delta row of each voxel layer;
transmitting each run length encoded delta row of each voxel layer to a 3D printer;
decoding each run length encoded delta row of each voxel layer to provide each delta row of each voxel layer; and
for each voxel layer:
XORing the key voxel row with the initial delta row to provide the initial voxel row; and
for each delta row from the delta row following the initial delta row, XORing each delta row with the previous voxel row to provide the voxel row for each delta row.

5. A method comprising:
receiving, via a processor, a three-dimensional (3D) model of an object to be 3D printed;
voxelizing, via the processor, the 3D model to define a plurality of voxel layers between an initial voxel layer and a final voxel layer;
exclusively oring (XORing), via the processor, a key voxel layer with the initial voxel layer to provide an initial delta layer; and
for each voxel layer from the voxel layer following the initial voxel layer to a further voxel layer of the plurality of voxel layers, XORing via the processor each voxel layer with the previous voxel layer to provide a delta layer for each voxel layer,
wherein each delta layer includes a plurality of rows extending between an initial row and a final row, the method further comprising for each delta layer:
XORing a key row with the initial row to provide an initial delta row; and
for each row from the row following the initial row to a further row of the plurality of rows, XORing each row with the previous row to provide a delta row for each row.

6. The method of claim 5, further comprising:
XORing the key row with the row following the further row to provide a further initial delta row; and
for each row from the row following the row following the further row to a yet further row of the plurality of rows, XORing each row with the previous row to provide a delta row for each row.

7. The method of claim 5, further comprising:
run length encoding each delta row of each delta layer.

8. A method comprising:
receiving, via a processor, a three-dimensional (3D) model of an object to be 3D printed;
voxelizing, via the processor, the 3D model to define a plurality of voxel layers between an initial voxel layer and a final voxel layer;
exclusively oring (XORing), via the processor, a key voxel layer with the initial voxel layer to provide an initial delta layer;
for each voxel layer from the voxel layer following the initial voxel layer to a further voxel layer of the plurality of voxel layers, XORing via the processor each voxel layer with the previous voxel layer to provide a delta layer for each voxel layer;
XORing the key voxel layer with the voxel layer following the further voxel layer to provide a further initial delta layer; and
for each voxel layer from the voxel layer following the voxel layer following the further voxel layer to a yet further voxel layer of the plurality of voxel layers, XORing each voxel layer with the previous voxel layer to provide a delta layer for each voxel layer.

9. The method of claim 8, wherein the XORing for each voxel layer from the voxel layer following the initial voxel layer to the further voxel layer is implemented in parallel with the XORing for each voxel layer from the voxel layer following the voxel layer following the further voxel layer to the yet further voxel layer.

10. A system comprising:
a machine-readable storage medium storing instructions and a three-dimensional (3D) model of an object; and
a processor to execute the instructions to:
voxelize the 3D model to define a plurality of voxel layers between an initial voxel layer and a final voxel layer, each voxel layer defining a plurality of voxel rows extending between an initial voxel row and a final voxel row;
for each voxel layer:
exclusively or (XOR) a key voxel row with the initial voxel row to provide an initial delta row; and
for each voxel row from the voxel row following the initial voxel row to a further voxel row of the plurality of voxel rows, XOR each voxel row with the previous voxel row to provide a delta row for each voxel row;
run length encode each delta row of each voxel layer; and
for each voxel layer:
XOR the key voxel row with the initial delta row to provide the initial voxel row; and
for each delta row from the delta row following the initial delta row, XOR each delta row with the previous voxel row to provide the voxel row for each delta row.

11. The system of claim 10, wherein the processor is to execute the instructions to further:
compress or encrypt the run length encoded delta rows of each voxel layer.

\* \* \* \* \*